United States Patent
Stasio

(10) Patent No.: US 11,920,919 B2
(45) Date of Patent: Mar. 5, 2024

(54) PROJECTING A STRUCTURED LIGHT PATTERN FROM AN APPARATUS HAVING AN OLED DISPLAY SCREEN

(71) Applicant: ams Sensors Asia Pte. Ltd, Singapore (SG)

(72) Inventor: Nicolino Stasio, Zürich (CH)

(73) Assignee: ams Sensors Asia Pte. Ltd, Singapore (SG)

( * ) Notice: Subject to any disclaimer, the term of this patent is extended or adjusted under 35 U.S.C. 154(b) by 87 days.

(21) Appl. No.: 17/616,658

(22) PCT Filed: Jun. 10, 2020

(86) PCT No.: PCT/SG2020/050323
§ 371 (c)(1),
(2) Date: Dec. 5, 2021

(87) PCT Pub. No.: WO2020/256634
PCT Pub. Date: Dec. 24, 2020

(65) Prior Publication Data
US 2022/0228857 A1    Jul. 21, 2022

Related U.S. Application Data

(60) Provisional application No. 62/864,068, filed on Jun. 20, 2019.

(51) Int. Cl.
*G01B 11/25*        (2006.01)
*G02B 27/00*        (2006.01)
(Continued)

(52) U.S. Cl.
CPC ...... *G01B 11/2513* (2013.01); *G02B 27/0093* (2013.01); *G06V 10/145* (2022.01);
(Continued)

(58) Field of Classification Search
CPC .. G01B 11/2513; G06V 10/145; G06V 20/64; G06V 2201/121; G02B 27/0093; H04M 1/0266; H10K 59/00
See application file for complete search history.

(56) References Cited

U.S. PATENT DOCUMENTS 7,499,147 B2 *   3/2009  Taniguchi .......... G02B 19/0014
                                                     355/77
10,509,147 B2   12/2019  Rossi
(Continued)

FOREIGN PATENT DOCUMENTS

CN    107 145 837 A    9/2017
EP    3 250 882 B1    11/2019
(Continued)

OTHER PUBLICATIONS

PCT Internat'l Search Report & Opinion of counterpart PCT/SG2020/050323, dated Oct. 16, 2020, 12 pgs.
(Continued)

*Primary Examiner* — Neil R Mikeska
(74) *Attorney, Agent, or Firm* — VIERING, JENTSCHURA & PARTNER MBB

(57) ABSTRACT

An apparatus includes a display screen that includes OLED pixels disposed at a particular pitch in a first plane. A light projector includes light emitting elements disposed in a second plane parallel to the first plane. The light emitting elements are disposed at the same pitch as the OLED pixels or at an integer multiple of the pitch of the plurality of OLED pixels. The light emitting elements are operable to produce light at a wavelength for transmission through the display screen, and the first and second planes are separated from one another by a distance D such that $d^2=2*(\lambda)*(D)/(N)$, where d is the pitch of the OLED pixels, $\lambda$ is the wavelength, and N is a positive integer.

17 Claims, 3 Drawing Sheets

(51) Int. Cl.
*G06V 10/145* (2022.01)
*G06V 20/64* (2022.01)
*H04M 1/02* (2006.01)

(52) U.S. Cl.
CPC .......... *G06V 20/64* (2022.01); *H04M 1/0266* (2013.01); *G06V 2201/121* (2022.01)

(56) References Cited

U.S. PATENT DOCUMENTS

| | | | |
|---|---|---|---|
| 2004/0065721 A1* | 4/2004 | Polvi | B23K 31/02 228/256 |
| 2007/0009222 A1 | 1/2007 | Koo et al. | |
| 2010/0027083 A1 | 2/2010 | Kroll et al. | |
| 2010/0046050 A1* | 2/2010 | Kroll | G03H 1/2294 359/9 |
| 2018/0173980 A1 | 6/2018 | Fan | |
| 2018/0267214 A1* | 9/2018 | Rossi | G02B 27/48 |
| 2020/0288070 A1* | 9/2020 | Siala | G01S 17/89 |

FOREIGN PATENT DOCUMENTS

| | | |
|---|---|---|
| TW | 201309093 A | 2/2013 |
| TW | 201638555 A | 11/2016 |

OTHER PUBLICATIONS

Yu-Hsiang Tsai, et al: "Image quality affected by diffraction of aperture structure arrangement in transparent active-matrix organic light-emitting diode displays", Applied Optics, vol. 54, No. 28, Aug. 28, 2015 (Aug. 28, 2015), p. E136-E140.

Machine Translation of CN107145837 A, downloaded on Dec. 10, 2020 (16 pages).

Taiwanese Search Report issued for the corresponding TW patent application No. TW109119467, dated Sep. 3, 2021, 1 page (For informational purposes only).

* cited by examiner

PROJECTING A STRUCTURED LIGHT PATTERN FROM AN APPARATUS HAVING AN OLED DISPLAY SCREEN

CROSS-REFERENCE TO RELATED APPLICATIONS

The present application is a National Stage application of, and claims priority of, and the benefit of International Application No. PCT/SG2020/050323, filed Jun. 10, 2020, entitled "PROJECTING A STRUCTURED LIGHT PATTERN FROM AN APPARATUS HAVING AN OLED DISPLAY SCREEN", which claims priority of, and the benefit of U.S. provisional Application No. 62/864,068, filed Jun. 20, 2019, entitled "PROJECTING A STRUCTURED LIGHT PATTERN FROM A DEVICE HAVING AN OLED DISPLAY SCREEN", each of which are hereby incorporated by reference in their entirety.

FIELD OF THE DISCLOSURE

The present disclosure relates to projecting a structured light pattern from an apparatus having an organic light-emitting diode (OLED) display screen.

BACKGROUND

Structured light can be used, for example, in applications where distances to objects present in a scene need to be determined. A light pattern created in the scene by the structured light makes it possible to distinguish objects according to their distance from the apparatus emitting the structured light. Game consoles, for example, may comprise a pattern projector for illuminating a scene with structured light in which a player is present, while the illuminated scene is imaged and analyzed so as to achieve a three-dimensional (3D) mapping of the scene, also referred to as depth mapping.

In another example, structured light may be used to identify a user. In such an example, the structured light may comprise an array of dots of light. A detector receives reflections of the dots of light, and a processor uses the reflected light to determine whether the face is the face of an authorized user. If the face is the face of an authorized user then the processor may unlock the apparatus and allow the apparatus to be used. The apparatus may for example be a smart phone or other portable host computing device.

SUMMARY

The present disclosure describes projecting a structured light pattern from an apparatus having an organic light-emitting diode (OLED) display screen. The apparatus may for example be a smartphone or a games console, or other portable host computing device.

For example, in one aspect, an apparatus includes a display screen that includes OLED pixels disposed at a particular pitch in a first plane. A light projector includes light emitting elements disposed in a second plane parallel to the first plane. The light emitting elements are disposed at the same pitch as the OLED pixels, or at an integer multiple of the pitch of the OLED pixels. The light emitting elements are operable to produce light at a wavelength for transmission through the display screen, and the first and second planes are separated from one another by a distance D such that $d^2=2*(\lambda)*(D)/(N)$, where d is the pitch, $\lambda$ is the wavelength, and N is a positive integer.

Some implementations include one or more of the following features. For example, in some instances, the OLED pixels are arranged in a two-dimensional array, and the light emitting elements are arranged in a two-dimensional array. The light emitting elements can be, for example, VCSELs. In some cases, the VCSELs (or other light emitting elements) are in an arrangement having an orientation that is the same as an orientation of an arrangement of the OLED pixels. The arrangement of the VCSELs may be shifted laterally in the second plane relative to the arrangement of the OLED pixels. Preferably, each of the plurality of VCSELs and the plurality of OLED pixels are arranged such that an orientation of the arrangement of VCSELs is not rotated with respect to an orientation of an arrangement of the OLED pixels.

In some instances, each of the light emitting elements is arranged to illuminate a respective subset of the OLED pixels, and each of the subsets includes multiple neighboring OLED pixels, such that light from each particular one of the light emitting elements passes through different ones of the OLED pixels in the respective subset so as to produce an interference pattern.

The display screen and light projector can be integrated, for example, as part of a portable computing device (e.g., a smartphone).

In accordance with another aspect, a method includes using light emitting elements to produce light at a wavelength k, and transmitting the light produced by the light emitting elements through a display screen that includes OLED pixels disposed at a particular pitch in a first plane. The light emitting elements are disposed in a second plane parallel to the first plane, and the light emitting elements are disposed at the same pitch as the plurality of OLED pixels (or at an integer multiple of that pitch). The first and second planes are separated from one another by a distance D such that $d^2=2*(\lambda)*(D)/(N)$, where d is the pitch, and N is a positive integer.

Some implementations include one or more of the following features. For example, in some instances, each of the light emitting elements illuminates a respective subset of the OLED pixels, and each of the subsets includes multiple neighboring OLED pixels, such that light from each particular one of the light emitting elements passes through different ones of the OLED pixels in the respective subset so as to produce an interference pattern.

In some cases, the light produced by the light emitting elements is transmitted through a display screen of a smart phone.

In some implementations, the interference pattern can be projected onto a scene, at least one object in the scene reflecting some of the light. The method can include sensing at least some of the reflected light, and using signals produced by the sensed light for eye-tracking or other applications.

Other aspects, features and advantages will be readily apparent from the following detailed description, the accompanying drawings, and the claims.

DETAILED DESCRIPTION

Figure 1:
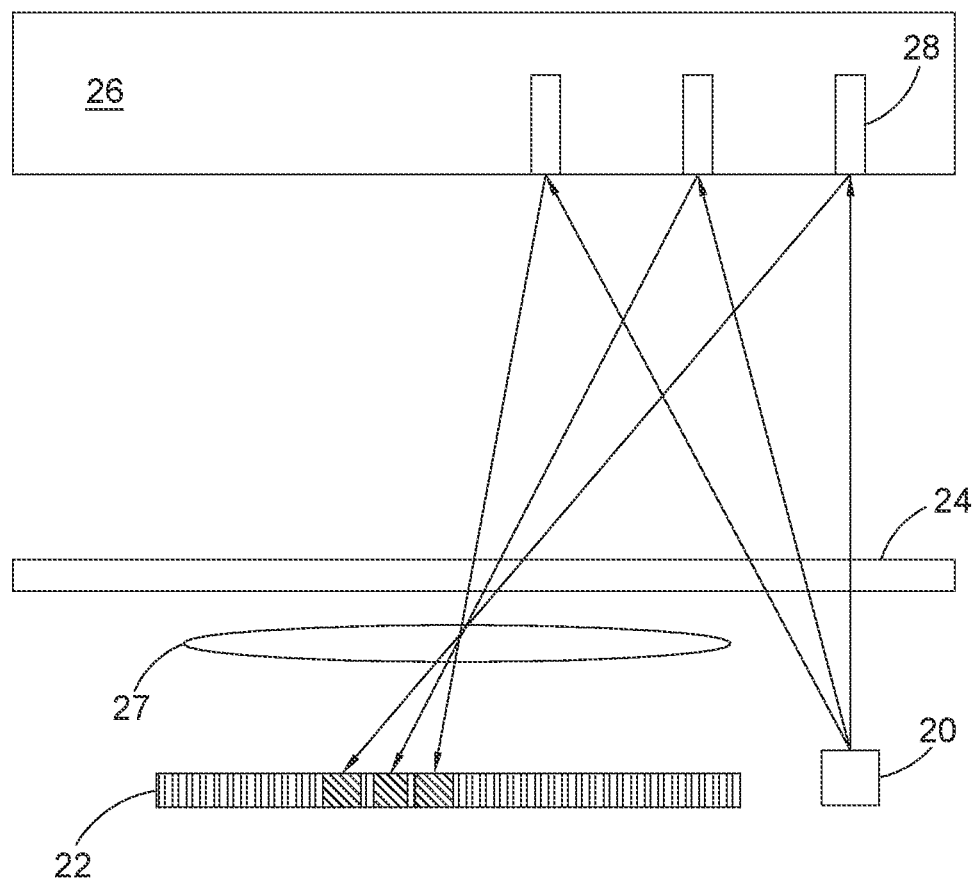
FIG. 1 illustrates an example of an apparatus according to an embodiment of the disclosure.

As illustrated in FIG. 1, an apparatus (optoelectronic system) includes a light projector 20 to project a structured light pattern 28 onto one or more objects in a scene 26 of interest. In some implementations, the projected pattern consists of light in the IR or near-IR region of the spectrum. Light from the projected pattern 28 can be reflected by one or more objects in the scene 26 and sensed by an image sensor 22 that includes spatially distributed light sensitive components (e.g., pixels) that are sensitive to a wavelength of light emitted by the light projector 20. The detected signals can be read-out and used, for example, by processing circuitry for stereo matching to generate a 3D image. In some cases, one or more optical elements such as lenses 27 help direct the light reflected from the scene 26 toward the image sensor 22. Using structured light can be advantageous, for example, in providing additional texture for matching pixels in the stereo images.

In another example the structured light pattern 28 may be reflected from a user's face, and the reflected light may be sensed by the image sensor 22. The detected signals may be used to create a depth map of a user's face. The depth map may then be compared with the depth map of an authorized user.

Figure 2:
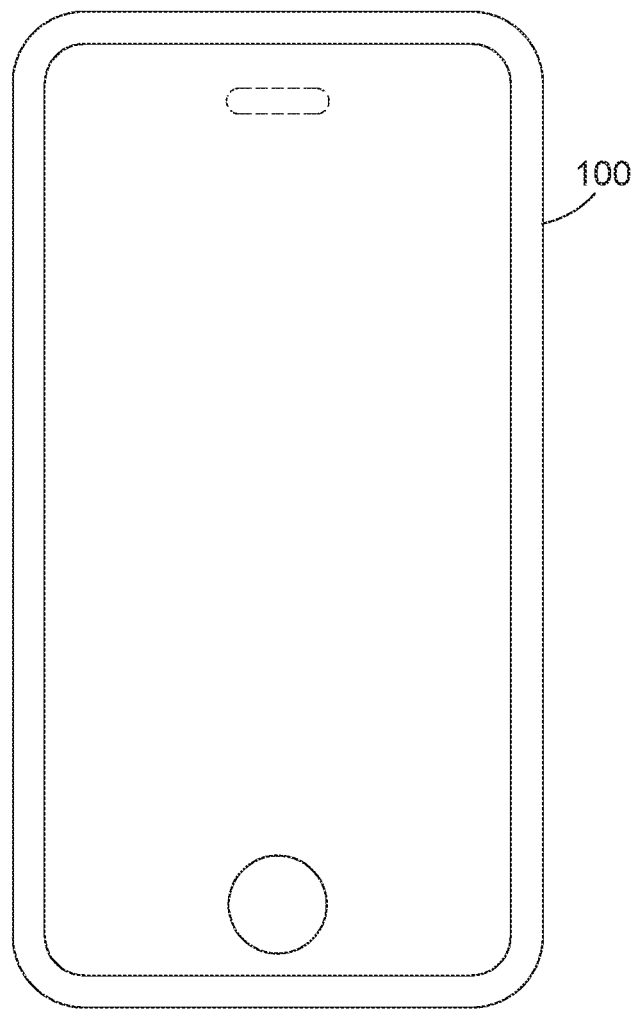
FIG. 2 illustrates an example of a portable host computing device into which aspects of the disclosure can be integrated.

In some implementations, the light projector 20, the lenses 27 and the image sensor 22 are integrated within a portable host computing device 100 (see FIG. 2) such as a mobile phone (cellular phone), smartphone, tablet, personal data assistant, or notebook computer with networking capability. In such cases, the light projector 20, the lenses 27 and the image sensor 22 can be disposed below a display screen 24 of the host device.

The display screen 24 can be implemented as an OLED display screen. An OLED is a light-emitting diode (LED) in which the emissive electroluminescent layer is a film of organic compound that emits light in response to an electric current. This organic layer is situated between two electrodes, at least one of which is transparent or semi-transparent to the light produced by the light projector 20. As an OLED's pixels produce their own light, the OLED display screen 24 does not require a backlight and can be ultra-thin. Further, the brightness of an OLED screen can be controlled on a pixel-by-pixel basis. These features makes OLED display screens highly suitable for portable host computing devices such as smart phones.

In general, the pitch of the OLED pixel array determines the resolution of an image displayed by the OLED display screen 24. Pixel pitch, for example, provides an indication of pixel density, calculated as the distance between the centers of two adjacent pixels. An equivalent measure is to indicate the pixels per inch (ppi). For example, some smartphones have a 5-inch (130 mm) display panel with 1920×1080 pixel array, corresponding to about 441 ppi (a pixel pitch of around 58 μm). Other smartphones have a 6-inch (150 mm) display panel with a 2:1 aspect ratio and a 2880×1440 pixel array at about 538 ppi (a pixel pitch of around 47 μm). Still other smartphones have a 2436×1125 pixel array at about 458 ppi (or a pixel pitch of about 55 μm). In general, the pixel pitch may be 30 μm or more. In general, the pixel pitch may be up to 70 μm. Some portable computing devices use OLED display screens having resolutions different from the foregoing examples.

As described in greater detail below, the light projector 20 is arranged such that light signals produced by the light projector pass through the OLED display screen 24 and produce the structured light pattern 28, which can include a pattern of discrete features projected onto one or more objects in a scene 26 external to the host device.

Figure 3:
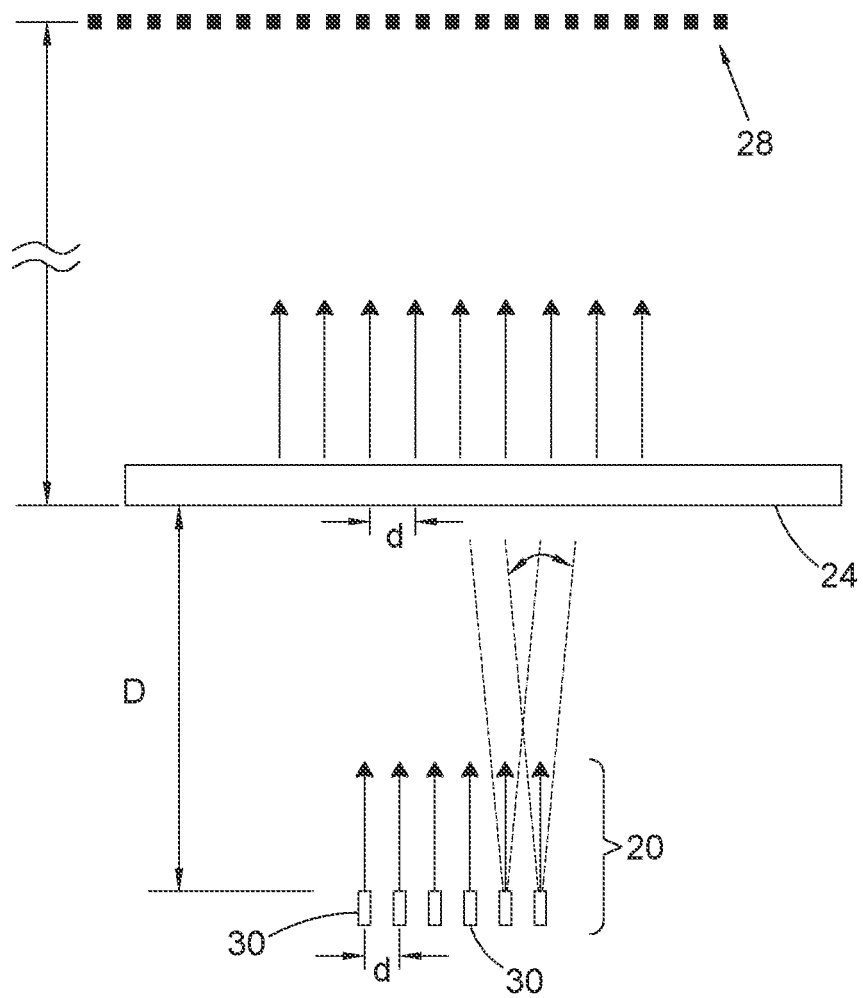
FIG. 3 illustrates further details of the apparatus according to some implementations of the disclosure.

As illustrated in FIG. 3, the light projector 20 can include, for example, one or more light emitting elements 30 (e.g. high power light emitting elements) such as an array of vertical cavity surface emitting lasers (VCSELs) operable to emit a predetermined narrow range of wavelengths, e.g., in the IR or near-IR part of the spectrum. Each of the light emitting elements 30 can be operable, for example, to emit light in the range of about 850 nm+/−10 nm, or in the range of about 830 nm+/−10 nm, or in the range of about 940 nm+/−10 nm. Different wavelengths and ranges may be appropriate for other implementations.

Each OLED pixel of the OLED display screen 24 includes a portion which is transmissive for infrared radiation (as emitted by the light emitting elements). This transmissive portion may for example be around half of the area of each pixel. The transmissive portion may for example be rectangular, hexagonal, or have some other shape. The transmissive portion of each OLED acts as an aperture through which light emitted by the light projector 20 passes. The OLED display screen acts as a two-dimensional diffraction grating. This causes interference in the light emitted by the VCSELs which may be used to obtain the structured light pattern 28.

To obtain a structured light pattern 28 that has strong contrast, the VCSEL array should have the same periodic arrangement, including the same pitch (or, equivalently, the same ppi), as the OLED pixel array. Thus, if the OLED display screen 24 has, for example, a regular arrangement of pixels at a pitch d, the VCSELs 30 should be arranged with same pitch. Further, the array of VCSELs 30 should have the same orientation as the array of OLED pixels in the display screen 24 (e.g., the grid containing the VCSEL and the grid containing the OLED pixels should have parallel axes). While the arrangement of the VCSELs 30 can be shifted (e.g., laterally in a plane parallel to the plane of the OLED pixels), the arrangement of VCSELs preferably should not be rotated with respect to the arrangement of OLED pixels in the display screen 24.

The distance between the planes of the VCSEL array and the OLED pixel array can referred to as D. Preferably, the plane containing the VCSEL array and the plane containing the OLED pixel array are parallel to one another. As shown in FIG. 3, a structured light pattern 28 created by the VCSEL light beams passing through the OLED display screen 24 is recorded in the far-field. Dark spots indicate locations of high light intensity, whereas white areas indicate regions of low light intensity. For specific selections of pitch d, wavelength λ and distance D, the contrast present in the structured light pattern 28 is particularly high, whereas for other distances D, only a much lower contrast is present in the created pattern. An equation describing the relationship of the values for the pitch d, the wavelength k, and the distance D for which a very sharp contrast in the structured light pattern 28 is obtained is as follows:

$$d^2 = 2^*(\lambda)^*(D)/(N),$$

where N designates a positive integer (e.g., 1, 2, 3, 4, etc.). As a particular example in which the VCSELs 30 emit light in the infra-red range of the spectrum (e.g. 940 nm), and the integer N is set at N=1, the distance (D) between the plane of the VCSEL array plane and the plane of the OLED pixel array is about 1.08 mm for a pitch (d) of about 45 µm. Different values may be appropriate for other implementations. If N=2 is used then a stronger contrast may be seen in the pattern 28, and the distance D may be halved (if other values are kept the same). The above equation is described in U.S. Pat. No. 10,509,147 (Rossi), the contents of which are hereby incorporated by reference.

In some instances, each of the VCSELs 30 is arranged to illuminate a respective subset of the pixels of the OLED display screen 24, and each of the subsets includes multiple neighboring pixels, such that light from each particular one of the VCSELs passes through different ones of the pixels in the respective subset so as to produce an interference pattern. All the interference patterns are superimposed so that the structured light produces a high-intensity interference pattern, which can be used to illuminate a scene. The fact that the structured light originates from an interference pattern created by the interference of light propagating through different ones of the OLED pixels makes it possible for the contrast of the structured light to remain substantially constant over a wide range of distances from OLED display screen 24 (e.g., in the far field such as from about 5 cm-10 cm to infinity).

In some instances, each of the OLED pixels and the VCSELs are arranged in an array (e.g., linear array or a 2D array).

In general, the patterned light projection formed from superimposed interference patterns is based on the periodicity of the VCSEL array and the OLED pixel array. The field of illumination (FOI) is limited by the divergence of the VCSELs 30. Thus, the techniques described above are particularly suitable for applications such as dot pattern recognition (e.g., eye-tracking) that require only a relatively small FOI. The techniques also can be useful for the 3D mapping of a scene or detecting movement of an object. Such applications can be integrated, for example, into a smart phone (see FIG. 2) and other portable computing devices that include an OLED display screen. The techniques may also be useful for facial recognition via depth mapping of a face (e.g. to determine whether a user is an authorized user of a smart phone or other portable computing device).

In the above described embodiment, the OLED display screen 24 has a regular arrangement of pixels at a pitch d and, the VCSELs 30 have the same pitch d. However, in other embodiments the pitch of the VCSELs 30 may be an integer multiple of the pitch of the OLED display screen. For example, the pitch of the VCSELs 30 may be 2d, may be 3d etc.

In some instances, the light projector 20, the lenses 28 and the image sensor 22 are components of the same optoelectronic module. In other implementations, the light projector 20 can be a discrete component that is not integrated into the same module as the image sensor 22 and/or lens 28.

The design of smart phones and other portable computing devices referenced in this disclosure can include one or more processors (e.g., a electronic control unit such as a microprocessor), one or more memories (e.g. RAM), storage (e.g., a disk or flash memory), a user interface (which may include, e.g., a keypad, an OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 Internet connection, etc.). The various components may be disposed beneath a cover glass.

The foregoing techniques can help achieve apparatus that are operable to produce a structured light pattern having high contrast. A microlens array is not required because the OLED display screen, acting as a two dimensional diffraction grating, provides interference patterns which superimpose to form the structured light pattern 28. Because the microlens array is not required the cost of the apparatus may be reduced.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination. Accordingly, other implementations are within the scope of the claims.

What is claimed is:

1. An apparatus comprising:
 a display screen including a plurality of OLED pixels disposed at a particular pitch in a first plane;
 a light projector including a plurality of light emitting elements disposed in a second plane parallel to the first plane, the plurality of light emitting elements being disposed at the same pitch as the plurality of OLED pixels, or at an integer multiple of the pitch of the plurality of OLED pixels, wherein the plurality of light emitting elements are operable to produce light at a wavelength for transmission through the display screen, and wherein the first and second planes are separated from one another by a distance D such that $d^2=2*(\lambda)*(D)/(N)$, where d is the pitch of the OLED pixels, $\lambda$, is the wavelength, and N is a positive integer,
 wherein each of the light emitting elements is arranged to illuminate a respective subset of the OLED pixels, and each of the subsets includes multiple neighboring OLED pixels, such that light from each particular one of the light emitting elements passes through different ones of the OLED pixels in the respective subset so as to produce an interference pattern so that the produced interference patterns are superimposed so as to produce a high-intensity interference pattern.

2. The apparatus of claim 1, wherein the OLED pixels are arranged in a two-dimensional array, and wherein the light emitting elements are arranged in a two-dimensional array.

3. The apparatus of claim 1, wherein the light emitting elements are VCSELs.

4. The apparatus of claim 1, wherein the plurality of VCSELs are in an arrangement having an orientation that is the same as an orientation of an arrangement of the plurality of OLED pixels.

5. The apparatus of claim 4 wherein the arrangement of the plurality of VCSELs is shifted laterally in the second plane relative to the arrangement of the plurality of OLED pixels.

6. The apparatus of claim 1, wherein each of the plurality of VCSELs and the plurality of OLED pixels are arranged such that an orientation of the arrangement of VCSELs is not rotated with respect to an orientation of an arrangement of the OLED pixels.

7. The apparatus of claim 1, wherein the display screen and the light projector are integrated as part of a portable computing device.

8. The apparatus of claim 7 wherein the portable computing device is a smartphone.

9. A method comprising:
using a plurality of light emitting elements to produce light at a wavelength $\lambda$; and
transmitting the light produced by the plurality of light emitting elements through a display screen that includes a plurality of OLED pixels disposed at a particular pitch in a first plane, wherein the plurality of light emitting elements are disposed in a second plane parallel to the first plane, the plurality of light emitting elements being disposed at the same pitch as the plurality of OLED pixels, or at an integer multiple of the pitch of the plurality of OLED pixels, and wherein the first and second planes are separated from one another by a distance D such that $d^2=2*(\lambda)*(D)/(N)$, where d is the pitch of the OLED pixels, and N is a positive integer,
wherein each of the light emitting elements is arranged to illuminate a respective subset of the OLED pixels, and each of the subsets includes multiple neighboring OLED pixels, such that light from each particular one of the light emitting elements passes through different ones of the OLED pixels in the respective subset so as to produce an interference pattern so that the produced interference patterns are superimposed so as to produce a high-intensity interference pattern.

10. The method of claim 9 wherein the light produced by the plurality of light emitting elements is transmitted through a display screen of a smartphone.

11. The method of claim 9 wherein
the interference pattern is projected onto a scene, at least one object in the scene
reflecting some of the light, and
sensing at least some of the reflected light.

12. The method of claim 11 further including using signals produced by the sensed light for eye-tracking.

13. The method of claim 9, wherein the light emitting elements are VCSELs.

14. The apparatus of claim 1, further comprising one or more lenses arranged between the display screen and the light projector.

15. The method of claim 9, wherein one or more lenses are arranged between the display screen and the plurality of light emitting elements.

16. The apparatus of claim 1, wherein the plurality of light emitting elements are operable to emit light in a range of about 850 nm+/−10 nm or in a range of about 830 nm+/−10 nm, or in the range of about 940 nm+/−10 nm.

17. The apparatus of claim 1, wherein each OLED pixel of comprises a portion which is transmissive for infrared radiation.

* * * * *